US012656427B2

(12) United States Patent
Bindseil et al.

(10) Patent No.: US 12,656,427 B2
(45) Date of Patent: Jun. 16, 2026

(54) MAGNET COOLDOWN THERMAL SWITCH APPARATUS

(71) Applicant: Synaptive Medical, Inc., Toronto (CA)

(72) Inventors: Geron André Bindseil, London (CA); William Bradfield Handler, London (CA)

(73) Assignee: SYNAPTIVE MEDICAL INC.

( * ) Notice: Subject to any disclaimer, the term of this patent is extended or adjusted under 35 U.S.C. 154(b) by 141 days.

(21) Appl. No.: 18/621,854

(22) Filed: Mar. 29, 2024

(65) Prior Publication Data

US 2025/0172644 A1     May 29, 2025

Related U.S. Application Data

(60) Provisional application No. 63/602,417, filed on Nov. 23, 2023.

(51) Int. Cl.
*G01R 33/34* (2006.01)
*G01R 33/38* (2006.01)
*H01F 6/04* (2006.01)

(52) U.S. Cl.
CPC ... *G01R 33/34023* (2013.01); *G01R 33/3403* (2013.01); *G01R 33/3804* (2013.01); *H01F 6/04* (2013.01)

(58) Field of Classification Search
CPC ......... G01R 33/34023; G01R 33/3403; G01R 33/3804; G01R 33/3815; H01F 6/04; F25D 19/006
See application file for complete search history.

(56) References Cited

U.S. PATENT DOCUMENTS

| | | | |
|---|---|---|---|
| 5,661,401 A | 8/1997 | Ishikawa et al. | |
| 6,067,001 A | 5/2000 | Xu et al. | |
| 6,157,280 A | 12/2000 | Arz et al. | |
| 6,278,275 B1 | 8/2001 | Petropoulos et al. | |
| 6,977,502 B1 | 12/2005 | Hertz | |
| 7,598,740 B2 | 10/2009 | Fischer et al. | |

(Continued)

FOREIGN PATENT DOCUMENTS

| | | |
|---|---|---|
| CN | 101297211 A | 10/2008 |
| CN | 104730475 B | 7/2020 |

(Continued)

OTHER PUBLICATIONS

English translation of WO2024/075424 provided by Espacenet. 2025. (Year: 2025).*

(Continued)

*Primary Examiner* — Rishi R Patel

(57) ABSTRACT

A thermal switch for thermally shorting the first and second stage of a cold head during early stages of cooldown of an MRI magnet for reducing the total cooldown time is disclosed. The thermal switch provides a thermal connection between the first and second stage of the cold head, and so the thermal shield and the cold mass are cooled down with the higher power of the first stage of the cold head while the overall temperature is greater than a threshold temperature. When the temperature drops below the threshold, the thermal connection becomes disconnected and then the cold mass is connected thermally only to the second stage, and the first stage remains connected to the thermal shield but isolated from the cold mass. This disconnection may be achieved passively, such as differential thermal contraction between cooling contacts and a support structure made from a different material.

16 Claims, 10 Drawing Sheets

(56)     References Cited

U.S. PATENT DOCUMENTS

| | | | |
|---|---|---|---|
| 8,319,495 B1 | 11/2012 | Zhu | |
| 8,390,288 B2 | 3/2013 | Graesslin et al. | |
| 8,720,072 B2 | 5/2014 | Bucco | |
| 11,320,500 B2 | 5/2022 | Authelet et al. | |
| 11,385,308 B2 | 7/2022 | Popescu | |
| 2015/0196221 A1 * | 7/2015 | Garside | F25D 19/006 |
| | | | 62/126 |
| 2017/0052237 A1 * | 2/2017 | Imamura | G01R 33/3804 |
| 2019/0108933 A1 | 4/2019 | Urbahn et al. | |
| 2022/0020516 A1 * | 1/2022 | Yu | G01R 33/3804 |
| 2024/0096535 A1 * | 3/2024 | Chorley | H01F 6/065 |

FOREIGN PATENT DOCUMENTS

| | | |
|---|---|---|
| CN | 111707690 B | 10/2022 |
| CN | 117100244 A | 11/2023 |
| DE | 4422781 C1 | 2/1996 |
| DE | 10025582 C1 | 12/2001 |
| JP | 3083475 B2 | 9/2000 |
| JP | 6062234 B2 | 1/2017 |
| JP | 7458316 B2 | 3/2024 |
| WO | 2004046745 A1 | 6/2004 |
| WO | WO-2024075424 A1 * | 4/2024 | H01F 6/04 |
| WO | WO-2025057698 A1 * | 3/2025 | H10N 60/30 |
| WO | WO-2025071418 A1 * | 4/2025 | H01F 6/006 |

OTHER PUBLICATIONS

English translation of WO2025/057698 provided by Espacenet. 2025. (Year: 2025).*

Harris et al.: "A New Approach to Shimming: The Dynamically Controlled Adaptive Current Network", Magnetic Resonance in Medicine, vol. 71, No. 2, pp. 859-869, published on Mar. 15, 2013 (Mar. 15, 2013).

* cited by examiner

MAGNET COOLDOWN THERMAL SWITCH APPARATUS

CROSS-REFERENCE TO RELATED APPLICATIONS

This application claims priority from U.S. provisional application No. 63/602,417, filed Nov. 23, 2023, the contents of which are incorporated herein by reference.

TECHNICAL FIELD

The field of the invention is systems and methods for magnetic resonance imaging ("MRI"), in particular, methods for reducing the time for initial cooldown for cryogen-free MRI magnets.

BACKGROUND

A magnet for a magnet resonance imaging (MRI) device is typically cooled down by a cold head cryocooler. The first stage of the cold head, with a power of ~40 W cools down the thermal shield to ~45K. The second stage of the cold head, with a power of ~1 W cools down the cold mass to ~4K. The cold mass has a much greater thermal mass than the thermal shield, therefore, the cool down typically takes many days on account of the weaker cooling power of the second stage of the cold head.

Thus, there is a need for a method and apparatus to reduce the duration of magnet cooldown.

SUMMARY

Figure 1:
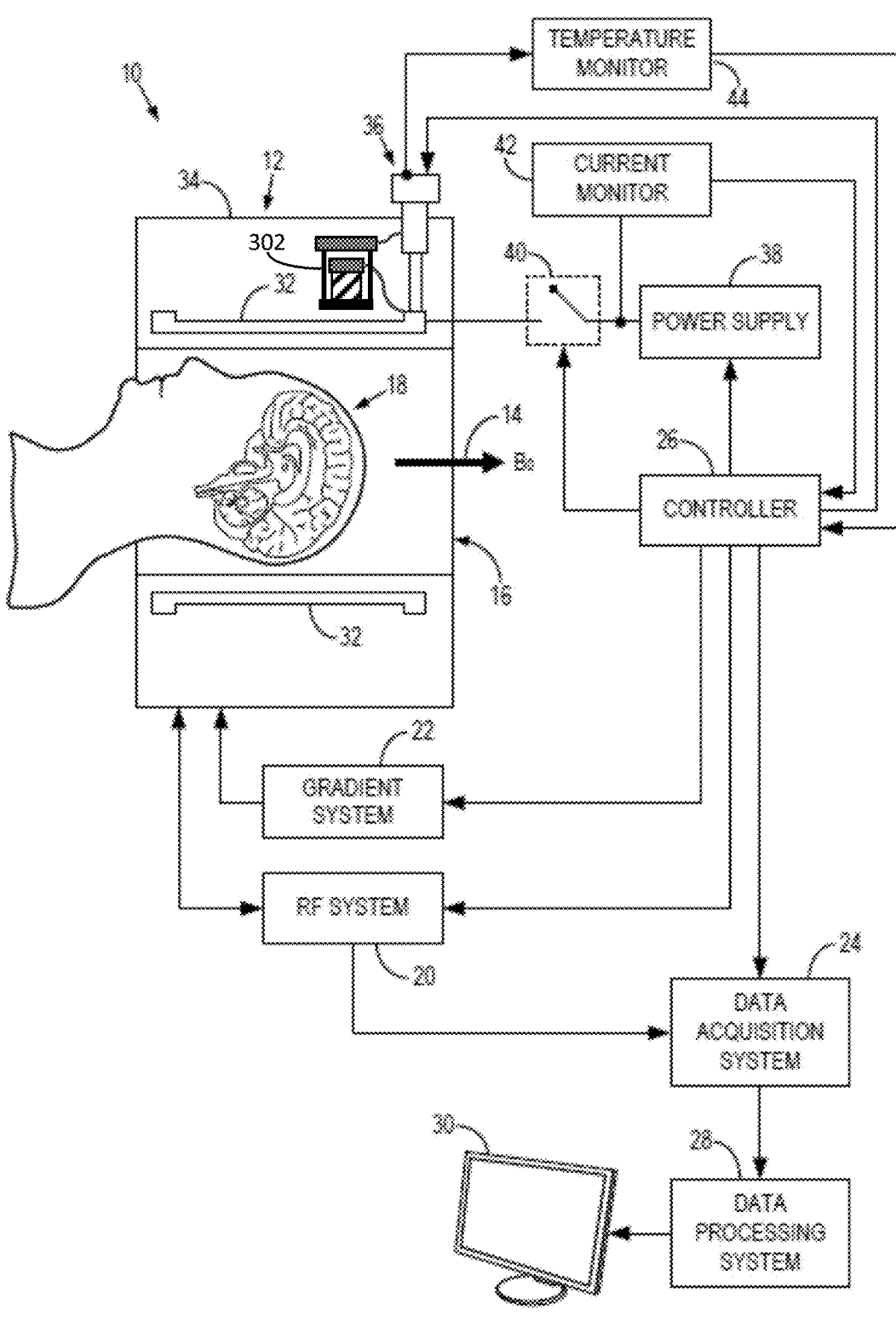
FIG. 1 is a block diagram of an example magnetic resonance imaging ("MRI") system that contains a thermal switch between the first and second stage of the cold head.

A thermal switch for thermally shorting the first and second stage of a cold head during the early stages of cooldown of an MRI magnet for reducing the total cooldown time is disclosed. The thermal switch provides a thermal connection between the first and second stage of the cold head, which means the thermal shield and the cold mass are cooled down with the higher power of the first stage of the cold head while the overall temperature is greater than a threshold temperature. When the temperature drops below the threshold, the thermal connection becomes disconnected and the cold mass is connected thermally only to the second stage, and the first stage remains connected to the thermal shield but isolated from the cold mass. This disconnection may be achieved through passive means, such as differential thermal expansion between cooling contacts and a support structure made from a different material, without relying on gas to conduct heat or relying on external actuation.

Thus, by one aspect of the present invention, a system is provided for reducing the magnet cooldown time of an MRI magnet, the system including a thermal switch having a first end and a second end, the first end connected to a first stage of a cryocooler for the magnet and the second end connected to a second stage of the cryocooler for the magnet, wherein the thermal switch is closed above a threshold temperature, thereby providing a thermal connection from the first stage to the second stage, for rapid cooling of the cold mass connected to the second stage with a cooling capacity of the first stage; and the thermal switch is open below the threshold temperature, thereby disconnecting the thermal connection from the first stage to the second stage.

By another aspect of the present invention, a method is provided for reducing the magnet cooldown time of an MRI magnet, the method including providing a thermal switch between a first stage and a second stage of a cryocooler of the magnet, closing the thermal switch above a threshold temperature to provide a thermal connection between the first stage and the second stage of the cryocooler, cooling the magnet above the threshold temperature with the thermal switch closed to gain cooling of the cold mass of the magnet connected to the second stage of the cryocooler from the first stage of the cryocooler, opening the thermal switch at the threshold temperature and cooling the magnet below the threshold temperature with the thermal switch open to disconnect the thermal connection between the first stage and the second stage and lose cooling of the second stage of the cryocooler from the first stage of the cryocooler.

DETAILED DESCRIPTION

Described here are systems and methods for improving cooldown of a magnetic resonance imaging ("MRI") system that includes a superconducting magnet cooled by a two-stage cryocooler.

Recently, there have been advances in superconducting magnet designs aimed at reducing or eliminating the expensive liquid cryogen, typically liquid helium, required to achieve and maintain superconducting properties of conventional low temperature superconducting wire, typically composed of Niobium Titanium strands in a copper matrix. These advances include the development of cryogen-free magnet designs that use a two-stage cryocooler to cool the magnet coils through thermal contact and without a liquid cryogen bath.

Conventional MRI systems that accommodate liquid cryogens may be cooled by piping into the magnet cryostat large quantities of liquid cryogen prepared off site. During this process a significant amount of cryogen is boiled off and wasted, cooling the large thermal mass of a magnet relatively quickly. In contrast, MRI magnets that are designed to contain little or no liquid cryogen within the cryostat rely on contact cooling by the refrigeration cycle of the cryocooler during cooldown. The rate of heat extraction from a cryocooler system is significantly lower than that of liquid cryogen evaporation and as a result, cooldown times on cryogen-free MRI systems can be up to several weeks depending on the particular design. Cooldown of an MRI magnet is not only required during manufacturing and initial installation, but also possibly during field service if the magnet must be brought to room temperature.

The MRI system described here uses a cryocooler system containing a two-stage cold head, where the first stage is in thermal contact with a thermal shield to cool it to temperatures approaching ~45 K, and where the second stage is in thermal contact with the cold mass containing the superconducting magnet coils and other supporting components to cool them to temperatures approaching 4 K. Here, thermal contact can include direct or indirect contact, through which thermal energy can be transferred or conducted. The superconducting wire used for the magnet design preferably maintains superconducting properties up to temperatures approaching 8 K. In the described system, current can be added or removed from the conductive windings of the magnet coils by introducing a power supply source into the circuit while activating a superconducting persistent mode switch or by some other means. Supplying this current to the magnet coils introduces heat into the system, which can be removed using the thermal cooling capacity of the cryocooler. Typically, a pair of charging leads constructed with high temperature superconductor is used to convey current into and out of the magnet during charging or discharging to reduce the heat generated as well as reduce the heat leak into the cold mass from warmer structures when not charging or discharging the magnet.

Furthermore, as cooling capacity is generally much greater on the first stage compared with the second stage during cooldown, cooldown time of the entire system including cold mass can be improved by making a better thermal connection between the first stage and the cold mass during the initial period of cooldown when the cold mass is above some threshold temperature. However, such a thermal short must be removed at some point during the cooldown so that the second stage and cold mass can achieve a much lower temperature than the first stage.

Referring now to FIG. 1, a magnetic resonance imaging system 10 generally includes a magnet assembly 12 for providing a magnetic field 14 that is substantially uniform within a bore 16 that may hold a subject 18 or other object to be imaged. The magnet assembly 12 supports a radio frequency ("RF") coil (not shown) that may provide an RF excitation to nuclear spins in the object or subject (not shown) positioned within the bore 16. The RF coil communicates with an RF system 20 producing the necessary electrical waveforms, as is understood in the art.

The magnet assembly 12 also supports three axes of gradient coils (not shown) of a type known in the art, and which communicate with a corresponding gradient system 22 providing electrical power to the gradient coils to produce magnetic field gradients, $G_x$, $G_y$, and $G_z$ over time.

A data acquisition system 24 connects to RF reception coils (not shown) that are supported within the magnet assembly 12 or positioned within bore 16.

The RF system 20, gradient system 22, and data acquisition system 24 each communicates with a controller 26 that generates pulse sequences that include RF pulses from the RF system 20 and gradient pulses from gradient system 22. The data acquisition system 24 receives magnetic resonance signals from the RF system 20 and provides the magnetic resonance signals to a data processing system 28, which operates to process the magnetic resonance signals and to reconstruct images therefrom. The reconstructed images can be provided to a display 30 for display to a user.

The magnet assembly 12 includes one or more magnet coils as part of a cold mass 32 housed in a vacuum housing 34, which generally provides a cryostat for the cold mass 32, and cooled by a cryocooler 36, such as a Gifford-McMahon ("GM") cryocooler or a pulse tube ("PT") cryocooler. In general, the cryocooler 36 is in thermal contact with the cold mass 32 and is operable to lower the temperature of the cold mass 32 and to maintain the magnet coils in the cold mass 32 at a desired operating temperature. The magnet coils together with other supporting structures and components, comprise the cold mass 32. The cryocooler 36 includes a first stage in thermal contact with the thermal shield 33 and a second stage in thermal contact with the cold mass 32. The first stage of the cryocooler 36 maintains the thermal shield 33 at a first temperature and the second stage of the cryocooler 36 maintains the cold mass 32 at a second temperature that is lower than the first temperature. A thermal switch 302 may be connected on one end to the first stage of the cryocooler 36 and on the other end to the second stage of the cryocooler 36. When the temperature of the thermal switch 302 is above a threshold temperature, the thermal switch is closed and provides a high thermal conductance path from the cold mass 32 to the first stage of the cryocooler 36. When the temperature of the thermal switch 302 is below a threshold temperature, the thermal switch is open and does not allow significant thermal conductance between the cold mass 32 and the first stage of the cryocooler 36.

According to the disclosure, the thermal switch provides a thermal connection between the first and second stage of the cold head, which means the thermal shield and the cold mass are cooled down with the higher cooling capacity or cooling power of the first stage of the cold head. When the temperature drops below a certain threshold temperature, the thermal connection becomes disconnected, and then the cold mass is connected thermally only to the second stage, and the first stage is connected thermally only to the thermal shield.

In one embodiment, the disconnect happens passively due to the geometry and material properties of the thermal switch device. In this embodiment, the thermal switch may be composed of at least two materials: at least one thermally conductive material to facilitate conduction cooling and at least one thermally insulating material having thermal expansion different than that of the thermally conductive material. Components of the thermally conductive materials are mechanically connected to components of the thermally insulating materials. At temperatures above the threshold temperature, the structure made of the thermally insulating materials is pre-loaded, either through compression or tension, such that the components made of thermally conductive material make a thermal connection between the ends of the thermal switch. As the device cools, the materials of the thermal switch contract and the internal stresses of the thermally insulating material relax until they reach a threshold temperature condition where the thermally insulating structures stop providing a force between faces of the thermally conductive structures. Below the threshold temperature, the differential contraction between the thermally insulating materials and the thermally conductive materials causes the faces of the thermally conductive materials to separate. Under such lower temperature conditions, conductive heat transfer occurs only through the thermally insulating materials and thermal conduction is thereby significantly reduced compared with higher temperature conditions. An example of such an embodiment uses copper as the thermally conductive material and a combination of G10 and nylon as the thermally insulating materials. At room temperature, two pieces of copper are pre-loaded in compression by the G10 and nylon, forming a thermal connection between the thermal connection ends of the thermal switch. One of the copper pieces is mounted on a nylon rod. The copper faces are compressed together by placing tension on G10 straps. As the device cools, the nylon rod experiences a greater absolute thermal contraction than G10, such that the two copper faces pull away from each other at a temperature of approximately 100 K.

In the preceding and following discussion, the terms thermal expansion and thermal contraction are descriptors of the thermal properties of materials and may be used interchangeably. The thermal expansion coefficient defines the fractional change in the geometry of the material per unit increase in temperature. The terms thermal expansion and thermal contraction refer to the relative or fractional change in the dimensions of a material between two temperatures. Typically, a material is said to experience thermal contraction when its dimensions have decreased when the material is at a lower temperature than a reference temperature. Similarly, a material is said to experience thermal expansion when its dimensions have increased when the material is at a higher temperature than a reference temperature.

There is still some minor thermal conduction connection across the thermal switch even when the thermally conductive materials are not in contact; however, the thermal switch allows there to be a high thermal conductance during early stages of cooldown when temperatures are warmer and then a low thermal conductance during later stages of cooldown when temperatures are lower. Under lower temperature conditions, better isolation between first and second stage is needed to achieve lower temperatures on the second stage of the cold head.

Figure 2:
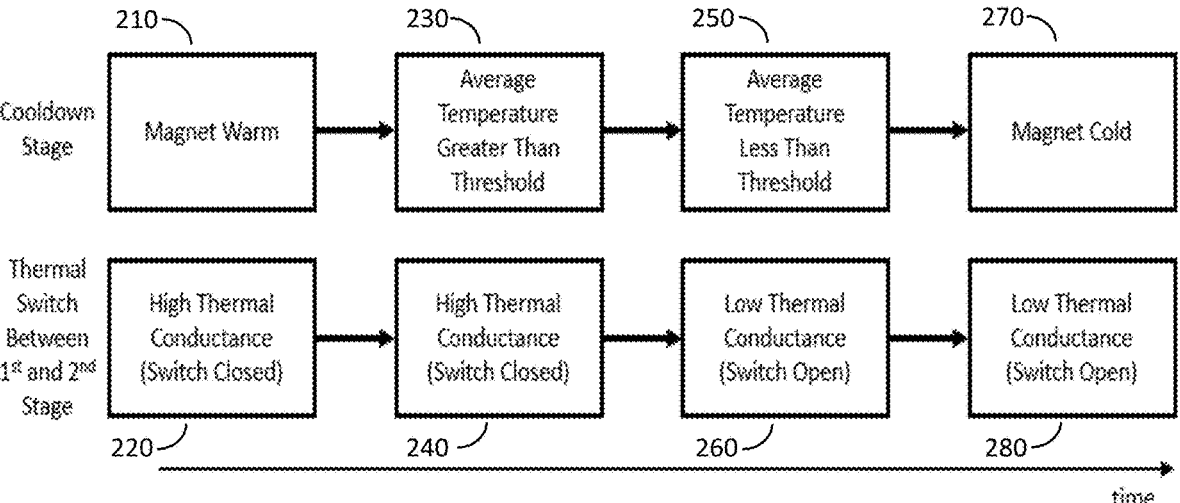
FIG. 2 is a block diagram illustrating a sequence of cooldown stages of an MRI magnet that contains a thermal switch between the first and second stage of the cold head.

FIG. 2 is a block diagram illustrating the stages of cooldown of an MRI system equipped with a thermal switch designed to improve cooldown rate. The process is as follows. The magnet begins in a warm state 210, for example, room temperature or approximately 300 K and in this state the thermal switch is closed 220. Next, the cryocooler is activated and heat energy is being removed through the first and second stages of the cold head. Initially, the average temperature is above the threshold temperature 230 and the switch remains closed and in a high thermal conductance state 240, whereby the thermal energy of the cold mass is being extracted through the second stage and also simultaneously through the first stage by means of the thermal connection made through the thermal switch. Next, after some duration, the average temperature of the thermal switch decreases sufficiently to fall below the threshold 250 causing the thermal switch to open and be in a low thermal conductance state 260, whereby the thermal energy of the cold mass is being extracted primarily through the second stage only. Finally, at some later time, the magnet cold mass has reached its final temperature 270 and the thermal switch remains open and in a low thermal conductance state 280.

The materials and geometry of the thermal switch should be designed such that the threshold temperature, below which the switch opens, is greater than the temperature at which the cryocooler's first stage capacity significantly exceeds the cryocooler's second stage capacity. For a typical two-stage cryocooler this temperature may be in the approximate range 45 K to 75 K, depending on the design of the cryocooler system. A thermal switch may be designed to open at an average temperature somewhat greater, such as for example at approximately 100 K.

Other thermal switch designs for improving cooldown time of cryogenic systems have been described; however, these typically rely on gas convection across a narrow gap or external mechanical actuation. These other approaches are more complicated to manufacture and may have increased risk of failure due to the need for gas tight interfaces in the physical design of the switch or use of an external bellows interface. The thermal switch design described in this disclosure is simple to manufacture and does not require tight tolerances or welded canisters for containing gas. Furthermore, the presence of a metal gas-tight sidewall in gas-gap thermal switches, typically stainless steel, is associated with higher thermal leak from first stage to second stage of the cold head compared with the approach described in this disclosure.

Figure 3:
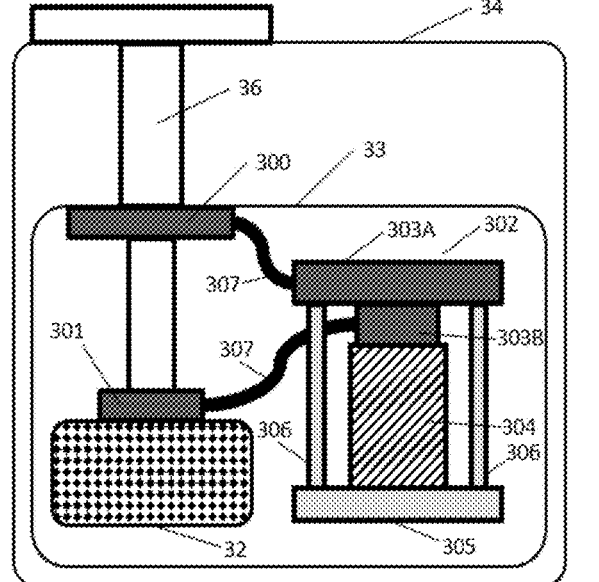
FIG. 3 is a simplified diagram showing the operation of the thermal switch during both high thermal conductance state and low thermal conductance state.
Figure 3:
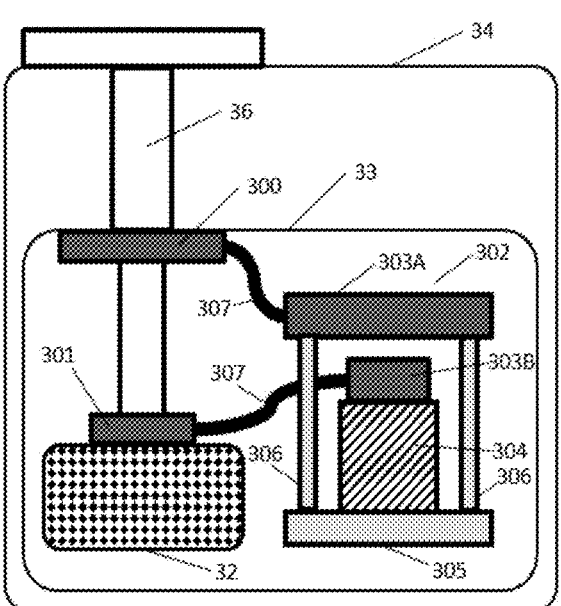

FIG. 3 is a simplified diagram showing the operation of the thermal switch during both high thermal conductance state (left image) and low thermal conductance state (right image). According to FIG. 3, the cryocooler 36 is attached to a vacuum housing 34. The cryocooler 36 consists of a first stage 300 connected directly to the thermal shield 33, and a second stage 301 connected directly to the cold mass 32 which contains magnet coils. A thermal switch 302 is connected to the cryocooler 36 (or cold head) through flexible thermal connections 307 which connect the thermally conductive material 303A to the first stage 300 and the thermally conductive material 303B to the second stage 301. The thermal switch 302 also contains thermally insulating material 304, 305, and 306 which are connected to each other. When the temperature of the thermal switch 302 is above the threshold temperature, as shown in FIG. 3, the thermally insulating material 304 is placed under tension, thereby placing faces of the thermally conductive materials 303A and 303B in physical and thermal contact. When the temperature of the thermal switch 302 is below the threshold temperature, as shown in FIG. 3, the components of the thermal switch 302 thermally contract relative to each other such that the compression of the thermally insulating material 304 is removed and the tension of the thermally insulating material 306 is removed, thereby causing the faces of the thermally conductive materials 303A and 303B to be physically and thermally separated. Thermally insulating material 305 may be combined or merged with thermally insulating materials 304 or 306. Thermally insulating material 304 must have a larger thermal contraction than thermally insulating material 306.

Figure 4:
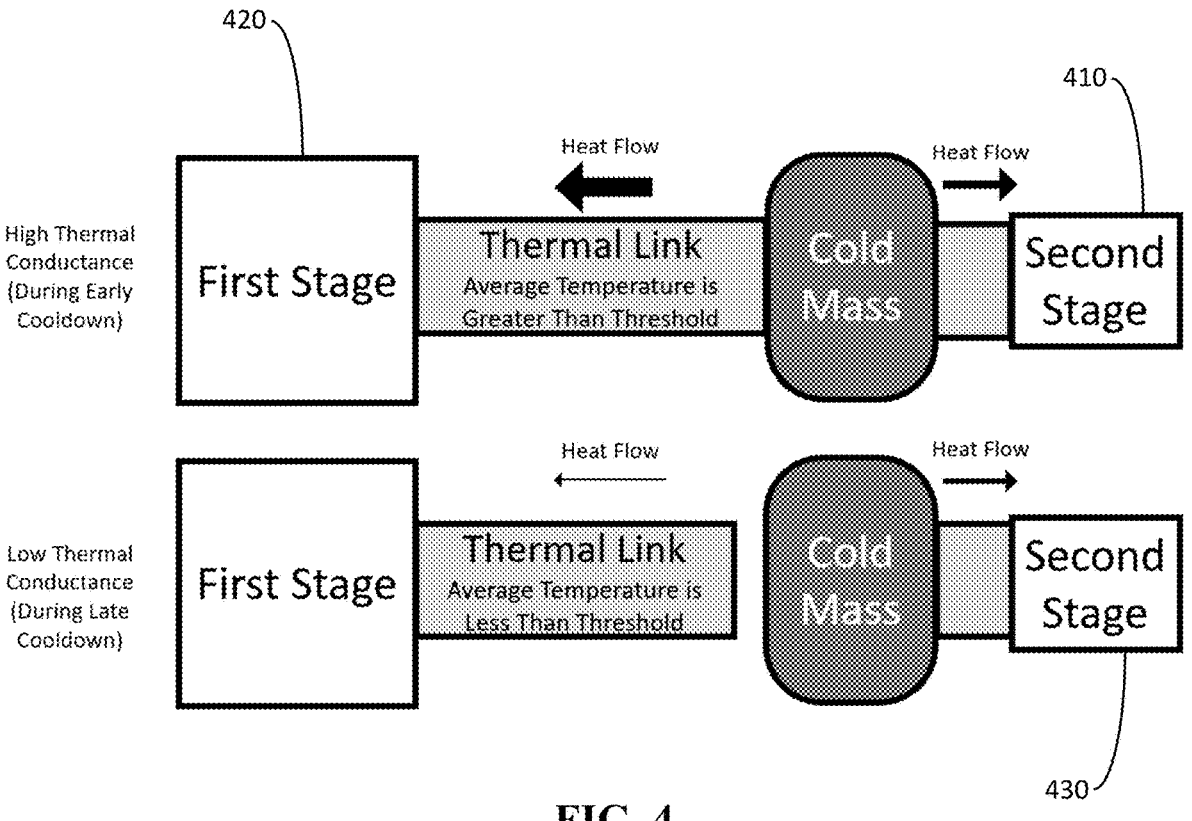
FIG. 4 is a block diagram illustrating the operation of a thermal link for low and high thermal conductance under both higher and lower temperature conditions.

FIG. 4 is a block diagram illustrating the interaction of a thermal link for low and high thermal conductance conditions. According to FIG. 4, during a high thermal conductance state (i.e., during early cooldown), heat energy is extracted from the cold mass through the second stage 410 as well as the first stage 420 when the heat switch is closed. According to FIG. 4, during a low thermal conductance state (i.e., during late cooldown), heat energy is extracted from the cold mass primarily through the second stage only 430.

Figure 5:
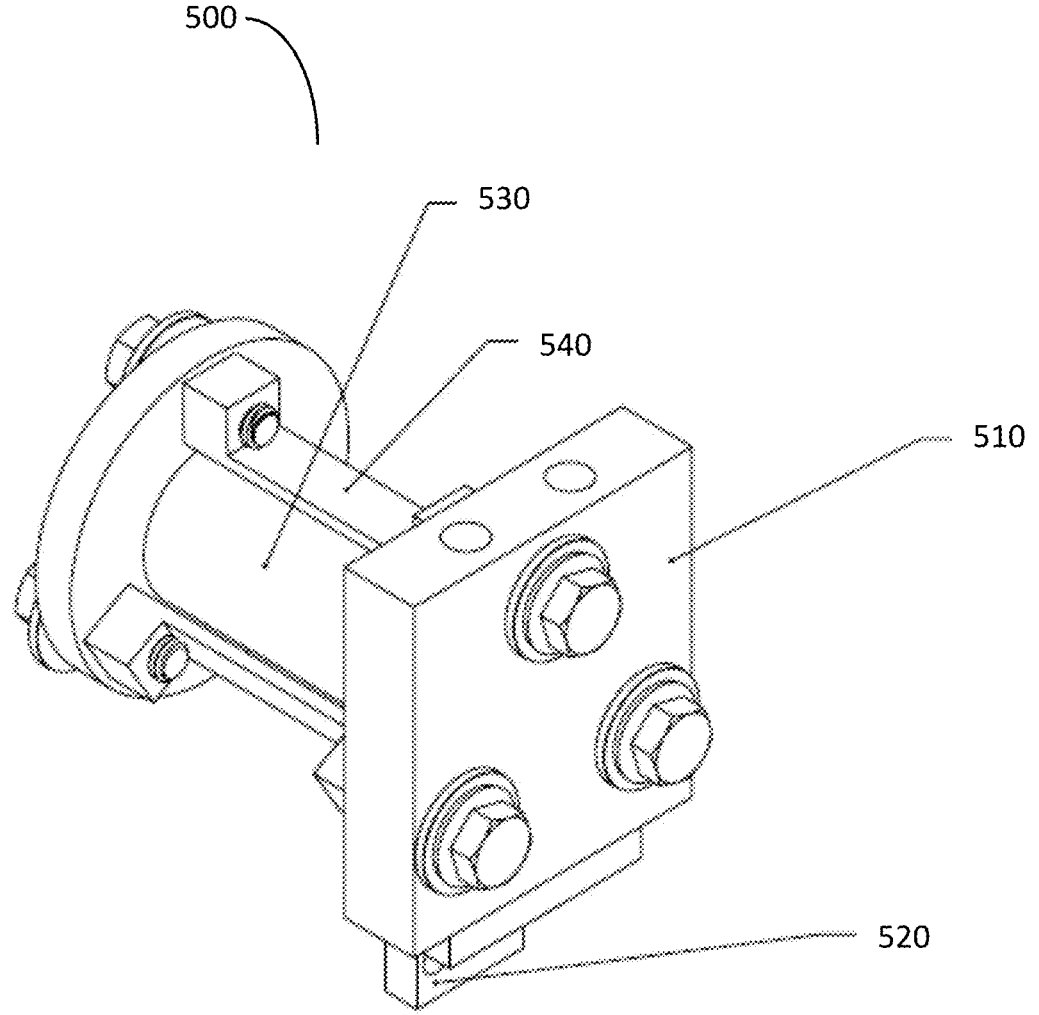
FIG. 5 is a line drawing of a perspective view of an exemplary thermal switch for reducing magnet cool down time.

FIG. 5 is a line drawing of a perspective view of an exemplary thermal switch for reducing magnet cool down time. According to FIG. 5, the thermal switch 500 comprises a thermal connection to first stage 510 made of copper, a thermal connection to second stage 520 made of copper, a nylon cylinder 530 and a tension strap 540 made of G10 fiberglass.

Figures 6A, 6B:
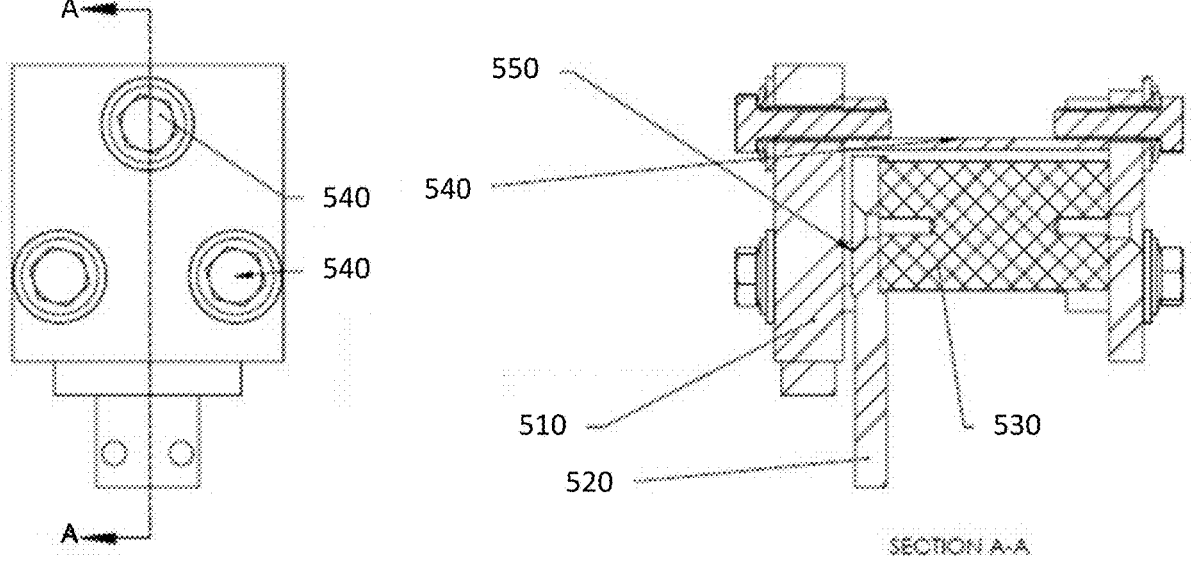
FIG. 6A is a line drawing top plan view of the exemplary thermal switch shown in FIG. 5.
FIG. 6B is a line drawing of the exemplary thermal switch shown in FIG. 6A, shown at cross section A-A, when the switch is open and the average temperature is below the exemplary threshold temperature.

FIG. 6A is a top plan view of the exemplary thermal switch shown in FIG. 5. FIG. 6B is a cross-sectional view of the exemplary thermal switch shown at cross section A-A of FIG. 6A. According to FIG. 6B, the thermal switch is shown to have thermal connection to first stage 510, thermal connection to second stage 520, nylon cylinder 530 and tension strap 540. Furthermore, the thermal switch is shown to have a gap 550 between thermal connection to first stage 510 and thermal connection to second stage 520 when cold, or below an exemplary threshold temperature 100K.

Figure 7A:
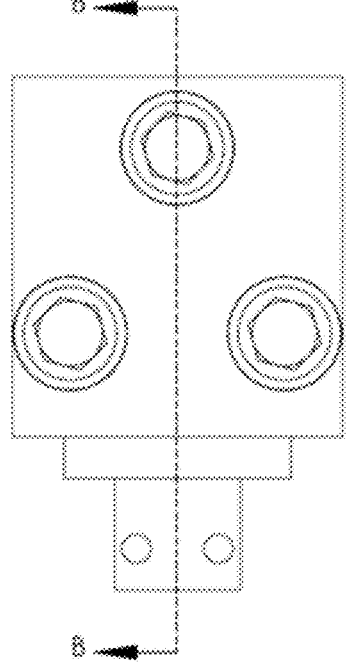
FIG. 7A is a line drawing top plan view of the exemplary thermal switch shown in FIG. 5.
Figure 7B:
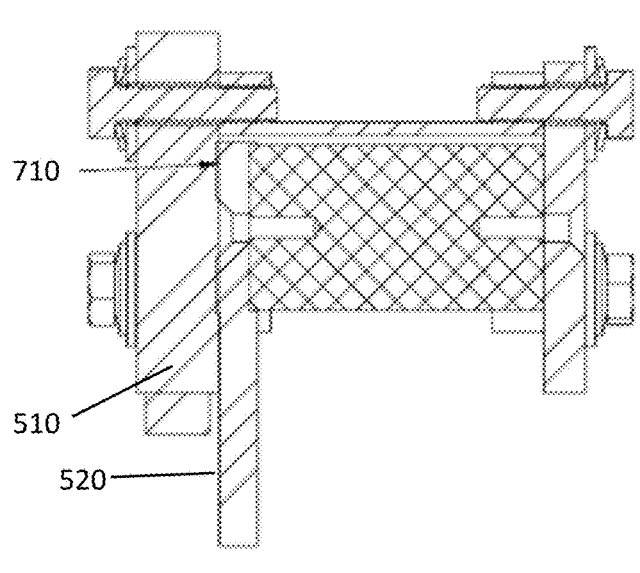
FIG. 7B is a line drawing of the exemplary thermal switch shown in FIG. 7A, shown at cross section B-B, when the switch is closed and the average temperature is above the exemplary threshold temperature.

FIG. 7A is a top plan view of the exemplary thermal switch shown in FIG. 5. FIG. 7B is a diagram illustrating a further cross-sectional view of the exemplary thermal switch shown at cross section B-B of FIG. 7A, where the thermal switch is shown to have physical contact 710 between thermal connection 510 and thermal connection 520 when warm, or above an exemplary threshold temperature 100K.

Figure 8:
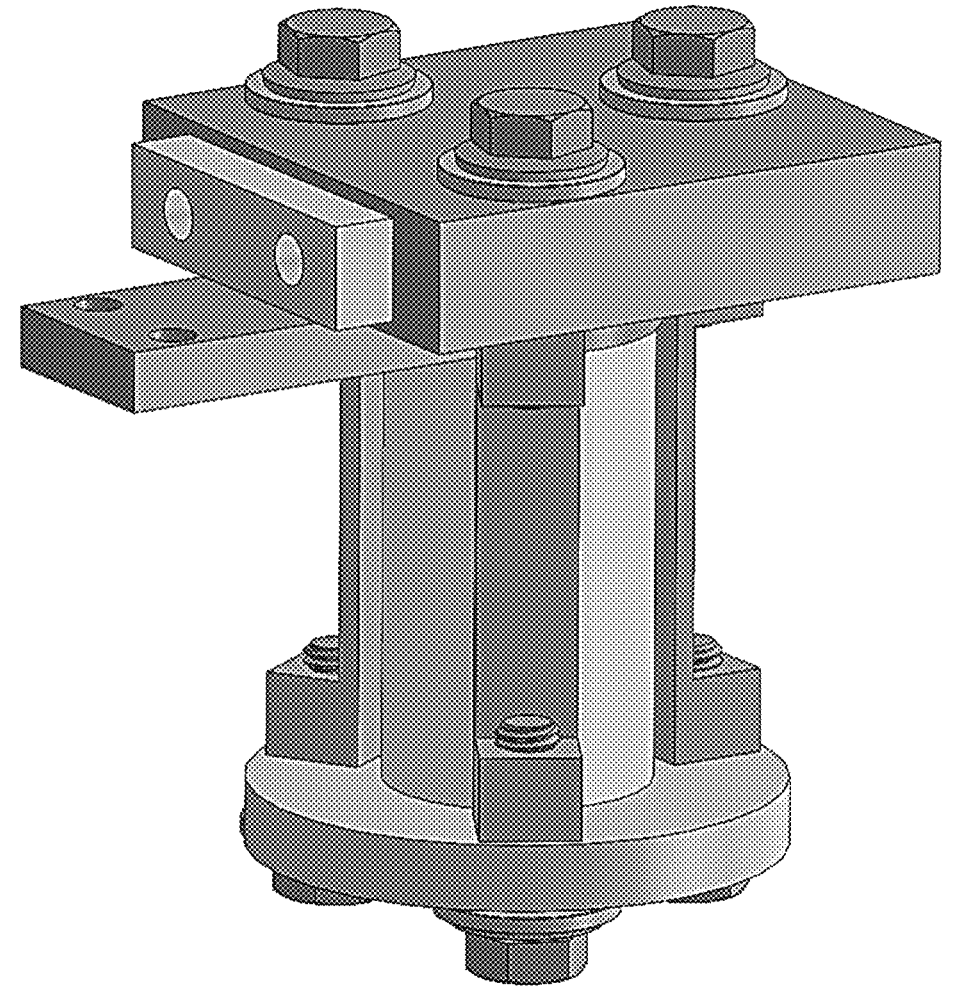
FIG. 8 is a diagram illustrating a further perspective view of an exemplary thermal switch.

FIG. 8 is a diagram illustrating a further perspective view of the exemplary thermal switch.

Figure 9:
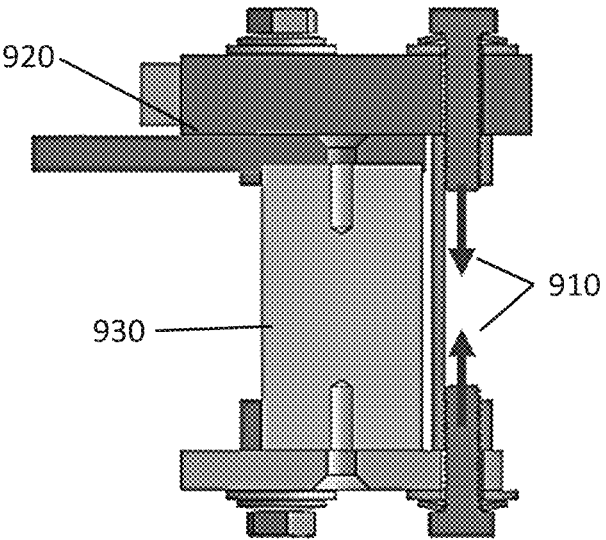
FIG. 9 is a diagram illustrating a cross-sectional view of an exemplary thermal switch when the switch is closed.

FIG. 9 is a diagram illustrating a sectional view of the exemplary thermal switch where the average temperature is warm and above the exemplary threshold temperature of 100K. According to FIG. 9, the G10 strap connections are under tension 910 and compressing the nylon 930 and resulting in physical contact 920 between the faces of the thermal connection components.

Figure 10:
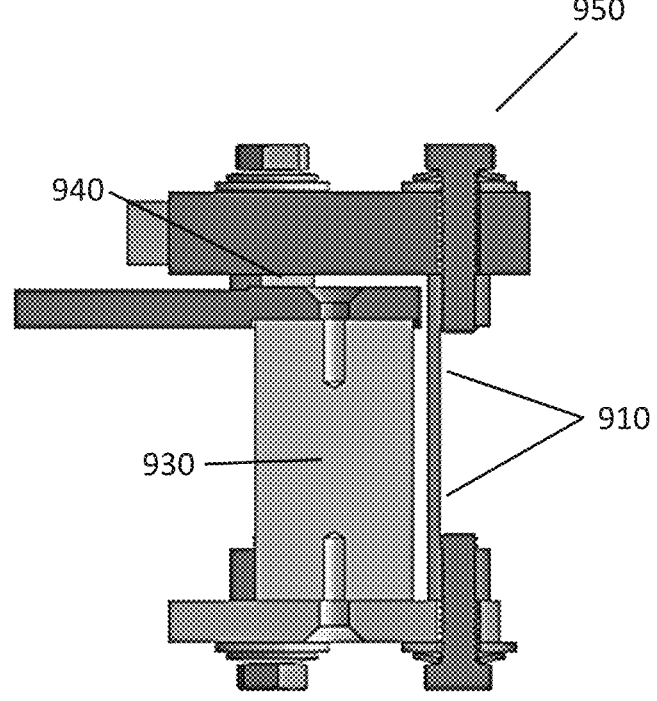
FIG. 10 is a diagram illustrating a cross-sectional view of an exemplary thermal switch when the switch is open.

FIG. 10 is a further diagram illustrating a sectional view of the exemplary thermal switch where the average temperature is cold and below the exemplary threshold temperature of 100K. According to FIG. 10, the nylon cylinder 930 shrinks more than the other materials including the G10 strap connections 910, thus causing the thermal connection components to pull away 940 and causing a disconnect of the thermal switch 950. Furthermore, adjusting the tension applied at room temperature allows for the disconnect threshold temperature to be adjusted. For example, at least one fastener holding the G10 strap may include a Belleville washer which enables a variable tension to be applied to the G10 strap by means of varying the fastening tension.

According to the disclosure, the thermal switch allows a higher cooling capacity of the cryocooler's first stage to be used for cooling for a significant part of the cool down time, to allow a speed up of the cool down process.

In other embodiments, the physical contact or separation between faces of the thermally conductive materials may be facilitated through different geometries. For example, in one embodiment the assembly could be constructed such that faces of the thermally conductive materials are pulled together under tension for the higher temperature closed condition. This may be facilitated by appropriate choice of geometry and materials with different thermal expansion properties.

In another embodiment, flexible structures may be included in the assembly, for example springs, to modify the stresses and strains of the thermal switch to improve its performance or make the thermal switch assembly more compact.

In another embodiment, a thermal interface material may be provided in between faces of the thermally conductive materials to facilitate improved thermal connection. For example, thermal grease or elastic thermal gaskets may be used to improve thermal contact when the thermal switch is closed.

In another embodiment, the contact faces of the thermal switch may be plated with a malleable metal, for example gold, in order to increase the surface area of contact while the faces are in contact with each other. In this case, the malleable metal plating may deform on a microscopic scale to lower the total contact thermal resistance when compared to the case without a malleable metal interface between the two thermal switch contact surfaces.

In another embodiment, a mechanical means of adjustment of the threshold temperature may be provided. For example, a fastener may be provided to adjust the separation or pre-load stress of the thermal switch to ensure the threshold temperature is within a certain desired range.

In another embodiment, the mating faces of the thermally conductive material may be shaped such that the thermal contact area is increased or to enable the thermal switch to be made more compact. For example, the thermally conductive faces may have interlocking angular features or the faces may be curved.

In another embodiment, there may be multiple mating faces of the thermally conductive material such that the thermal contact area is increased or to enable the thermal switch to be made more compact. An example of this embodiment is interlocking teeth or fins.

In another embodiment, the thermal switch may incorporate a means of active mechanical actuation to connect and separate the thermally conductive faces. For example, a mechanical drive may be provided to open or close the thermal switch manually by a direct or indirect connection external to the vacuum housing, or by electromechanical means internal or external to the vacuum housing. Such embodiments may omit the thermally insulating material that provides for differential thermal contraction. Such an external connection may be used to facilitate disabling the thermal switch without access to the internals of the vacuum vessel of the magnet in case of failure of the switch to operate as designed.

General Considerations

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

The specific embodiments described above have been shown by way of example and understood is that these embodiments may be susceptible to various modifications and alternative forms. Further understood is that the claims are not intended to be limited to the forms disclosed, but rather to cover all modifications, equivalents, and alternatives falling within the spirit and scope of this disclosure. While the foregoing written description of the system enables one of ordinary skill to make and use what is considered presently to be the best mode thereof, those of ordinary skill will understand and appreciate the existence of variations, combinations, and equivalents of the specific embodiment, method, and examples herein. The system should therefore not be limited by the above-described embodiment, method, and examples, but by all embodiments and methods within the scope and spirit of the system. Thus, the present disclosure is not intended to be limited to the implementations shown herein but is to be accorded the widest scope consistent with the principles and novel features disclosed herein.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become obvious to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, various changes and modifications in form, material, workpiece, and fabrication material detail may be made, without departing from the spirit and scope of the present disclosure, as set forth in the appended claims, as may be apparent to those of ordinary skill in the art, are also encompassed by the present disclosure.

What is claimed is:

1. A system for reducing a cooldown time of an MRI magnet, the system comprising:
   a thermal switch having a first end and a second end, the first end connected to a first stage of a cryocooler for the MRI magnet and the second end connected to a second stage of the cryocooler for the MRI magnet, wherein
      the thermal switch is closed above a threshold temperature, thereby providing a thermal connection from the first stage to the second stage, for cooling of a cold mass of the MRI magnet connected to the second stage with the cooling capacity of the first stage; and
      the thermal switch is open below the threshold temperature, thereby disconnecting the thermal connection from the first stage to the second stage,
   wherein the thermal switch comprises:
      a first thermally conductive contact thermally coupled to the first stage and a second thermally conductive contact thermally coupled to the second stage, the first and second thermally conductive contacts having mating faces that are in a physical contact when the thermal switch is closed and are separated by a gap when the thermal switch is open;
      a mechanical preload structure that applies a preload force at room temperature urging the mating faces into the physical contact, the mechanical preload structure comprising thermally insulating members including a first thermally insulating member and a second thermally insulating member having different thermal contraction; and
      wherein, during cooldown, differential thermal contraction of the first and second thermally insulating members reduces the preload force and causes separation of the mating faces at the threshold temperature to open the thermal switch.

2. The system of claim 1, wherein the MRI magnet comprises a cryogen-free MRI magnet and the first end and the second end of the thermal switch are exposed to a vacuum housing of the MRI magnet.

3. The system of claim 1, wherein the first thermally conductive contact and the second thermally conductive contact comprise copper and the first thermally insulating member comprises nylon and the second thermally insulating member comprises fiberglass.

4. The system of claim 1, further including a thermal interface material provided between the mating faces of the thermally conductive contacts to facilitate improved thermal connection.

5. The system of claim 1, wherein the mating faces of the thermally conductive contacts are plated with a malleable metal for increasing a surface area of contact when the thermal switch is closed.

6. The system of claim 1, wherein the mating faces of the thermally conductive contacts comprise a shape for at least one of: increasing an area of the mating faces; and enabling the thermal switch to be more compact.

7. The system of claim 6, wherein the shape of the mating faces comprise at least one of an interlocking angular feature and a curve.

8. The system of claim 1, further wherein a mechanical means of adjustment of the threshold temperature is provided.

9. The system of claim 1, wherein the thermal switch comprises a mechanical actuation to open and close the thermal switch.

10. The system of claim 9, wherein the mechanical actuation comprises at least one of: a mechanical drive to open and close the thermal switch manually by a connection external to a vacuum housing; and an electromechanical means.

11. A method for reducing a cooldown time of an MRI magnet, the method comprising:
   providing a thermal switch between a first stage and a second stage of a cryocooler of the MRI magnet, the thermal switch having a first end connected to the first stage and a second end connected to the second stage;
   closing the thermal switch above a threshold temperature to provide a thermal connection between the first stage and the second stage of the cryocooler;
   cooling the MRI magnet above the threshold temperature with the thermal switch closed to gain cooling of a cold mass of the MRI magnet connected to the second stage of the cryocooler from the first stage of the cryocooler;
   opening the thermal switch at the threshold temperature; and
   cooling the MRI magnet below the threshold temperature with the thermal switch open to disconnect the thermal connection between the first stage and the second stage,
   wherein the thermal switch comprises:
      a first thermally conductive contact thermally coupled to the first stage and a second thermally conductive contact thermally coupled to the second stage, the first and second thermally conductive contacts having mating faces that are in physical contact when the thermal switch is closed and are separated by a gap when the thermal switch is open;
      a mechanical preload structure that applies a preload force at room temperature urging the mating faces into the physical contact, the mechanical preload structure comprising thermally insulating members including a first thermally insulating member and a second thermally insulating member having different thermal contraction; and wherein, during cooldown, differential thermal contraction of the first and second thermally insulating members reduces the preload force and causes separation of the mating faces at the threshold temperature to open the thermal switch.

12. The method of claim 11, wherein the MRI magnet comprises a cryogen-free MRI magnet and the first end and the second end of the thermal switch are exposed to a vacuum housing of the MRI magnet.

13. The method of claim 11, wherein the threshold temperature is greater than a temperature at which the cryocooler's first stage capacity exceeds the cryocooler's second stage capacity.

14. The method of claim 11 wherein the threshold temperature is between 45 K and 100 K.

15. The method of claim 11, wherein the first insulating member is under an adjustable tension and adjusting the adjustable tension at room temperature changes the threshold temperature.

16. The method of claim 11, wherein the thermal switch is closed by mechanical tension and opened by an absence of the tension, where the absence of the tension is caused by differential thermal contraction of the insulating members.

* * * * *